US011893321B2

(12) United States Patent
Hermann et al.

(10) Patent No.: US 11,893,321 B2
(45) Date of Patent: Feb. 6, 2024

(54) ADAPTIVE COMPRESSION OF SIMULATION DATA FOR VISUALIZATION

(71) Applicant: Dassault Systemes, Vélizy-Villacoublay (FR)

(72) Inventors: Everton Hermann, Vélizy-Villacoublay (FR); Guilherme Cunha, Vélizy-Villacoublay (FR); Cyril Ngo Ngoc, Vélizy-Villacoublay (FR)

(73) Assignee: Dassault Systemes, Vélizy-Villacoublay (FR)

( * ) Notice: Subject to any disclaimer, the term of this patent is extended or adjusted under 35 U.S.C. 154(b) by 106 days.

(21) Appl. No.: 16/724,942

(22) Filed: Dec. 23, 2019

(65) Prior Publication Data
US 2020/0202053 A1  Jun. 25, 2020

(30) Foreign Application Priority Data
Dec. 21, 2018  (EP) ..................................... 18306832

(51) Int. Cl.
*G06F 30/20* (2020.01)
*G06F 17/13* (2006.01)
*G06F 17/18* (2006.01)

(52) U.S. Cl.
CPC .............. *G06F 30/20* (2020.01); *G06F 17/13* (2013.01); *G06F 17/18* (2013.01)

(58) Field of Classification Search
CPC .......... G06F 30/20; G06F 17/13; G06F 17/18; G06F 16/904; G06F 30/25; G06F 30/27; G06F 30/28; G06F 7/64; G06F 16/957
See application file for complete search history.

(56) References Cited

U.S. PATENT DOCUMENTS

2007/0239409 A1* 10/2007 Alan ...................... G06F 30/23
                                                            703/2
2012/0041734 A1*  2/2012 Chevalier .............. G06F 30/17
                                                            703/8
(Continued)

FOREIGN PATENT DOCUMENTS

JP       2006-101512        4/2006
JP       2013-161137        8/2013
(Continued)

OTHER PUBLICATIONS

Salloum, M., Fabian, N.D., Hensinger, D.M. et al. Optimal Compressed Sensing and Reconstruction of Unstructured Mesh Datasets. Data Sci. Eng. 3, 1-23 (Year: 2018).*

(Continued)

*Primary Examiner* — Michael Edward Cocchi
(74) *Attorney, Agent, or Firm* — Oblon, McClelland, Maier & Neustadt, L.L.P.

(57) ABSTRACT

The disclosure notably relates to a computer-implemented method for displaying a simulation. The method includes computing a full simulation. The full simulation includes states. The method further includes computing a reduced model of the computed full simulation. The reduced model includes a basis with elements. Each state of the full simulation is represented by a respective linear combination of basis elements. The method further includes displaying, for at least one state of the full simulation, a part of the respective linear combination. This constitutes an improved method for displaying a simulation.

6 Claims, 9 Drawing Sheets

(56) References Cited

U.S. PATENT DOCUMENTS

| | | | |
|---|---|---|---|
| 2016/0196366 A1* | 7/2016 | Astigarraga | G06F 30/367 703/13 |
| 2017/0046458 A1* | 2/2017 | Meagher | H02J 13/00 |
| 2017/0094295 A1* | 3/2017 | Gu | H04L 1/004 |
| 2017/0124761 A1* | 5/2017 | Michel | G06T 3/20 |
| 2017/0289622 A1* | 10/2017 | Roch | H04N 21/44218 |
| 2017/0324544 A1* | 11/2017 | Marin | H04L 9/002 |
| 2018/0268591 A1* | 9/2018 | Zhou | G06F 30/20 |
| 2019/0370420 A1* | 12/2019 | Feng | G06F 30/20 |

FOREIGN PATENT DOCUMENTS

| | | |
|---|---|---|
| JP | 2014-026440 | 2/2014 |
| WO | WO 2015/015630 A1 | 2/2015 |

OTHER PUBLICATIONS

J. Azar, A. Makhoul, R. Darazi, J. Demerjian and R. Couturier, "On the performance of resource-aware compression techniques for vital signs data in wireless body sensor networks," 2018 IEEE Middle East and North Africa Communications Conference (MENACOMM), 2018, pp. 1-6, (Year: 2018).*

Madisetti, Vijay, Jean Walrand, and David Messerschmitt. "Efficient distributed simulation." ACM SIGSIM Simulation Digest 20.1 (1989): 5-21. (Year: 1989).*

European Search Report dated Jun. 7, 2019, in Patent Application No. 18306833.7.

European Search Report dated Jun. 7, 2019, in Patent Application No. 18306834.5.

Extended European Search Report dated Aug. 1, 2019, in Patent Application No. 18306832.9.

Michel Bergmann, et al., "A zonal Galerkin-free POD model for incompressible flows", Journal of Computational Physics, vol. 352, XP055593066, 2018, pp. 301-325.

Emiliano Iuliano, et al., "Proper Orthogonal Decomposition, surrogate modelling and evolutionary optimization in aerodynamic design", Computers and Fluids, vol. 84, XP028684771, 2013, pp. 327-350.

Marijn P. Zwier, et al., "Physics in Design: Real-time numerical simulation integrated into the CAD Environment", Procedia Cirp, 27$^{th}$ Cirp Design, vol. 60, 2017, pp. 98-103.

Katrina Calautit, et al., "A Review of Numerical Modelling of Multi-Scale Wind Turbines and Their Environment", Computation, vol. 6, No. 24, Mar. 5, 2018, pp. 1-37.

Sara Louise Walker, et al., "Building mounted wind turbines and their suitability for the urban scale—A review of methods of estimating urban wind resource", Energy and Buildings, vol. 43, 2011, pp. 1852-1862.

Hong Huang, et al., "Urban thermal environment measurements and numerical simulation for an actual complex urban area covering a large district heating and cooling system in summer," Atmospheric Environment, vol. 39, Issue 34, 2005, pp. 6362-6375.

Stéphane Redonnet, "Development of a Hybrid Methodology for the Numerical Simulation in Aeroacoustics, with Application to the Mitigation of Aircraft Noise", [physics.class-ph] Aix-Marseille Universite, Thesis for an Accreditation to Supervise Research, Accreditation to Supervise Research (HDR), 2016, 251 pages.

J. Blazek, "Computational Fluid Dynamics: Principles and Applications", Elsevier Science, 2001, 456 pages.

Matthew F. Barone, et al., "Reduced Order Modeling of Fluid/Structure Interaction," Sandia National Laboratories Sandia Report, Sand No. 7189, Sep. 2009, 122 pages.

C. W. Rowley, "Model Reduction for Fluids, Using Balanced Proper Orthogonal Decomposition", Modeling and Computations in Dynamical Systems: In Commemoration of the 100th Anniversary of The Birth of John Von Neumann, vol. 13, Series B, 2006, pp. 301-317.

Clarence W. Rowley, et al., "Model reduction for compressible flows using POD and Galerkin projection", Physica D: vol. 189, 2004, pp. 115-129.

Francisco Chinesta, et al., "Model Order Reduction", Encyclopedia of Computational Mechanics, 2004, 59 pages.

Veroy, et al., "Certified real-time solution of the parametrized steady incompressible Navier-Stokes equations: rigorous reduced-basis *a posteriori* error bounds", International Journal for Numerical Methods in Fluids, vol. 47, XP055609183, 2005, pp. 773-788.

Alan Norton, et al., "The Vapor Visualization Application" High Performance Visualization: Enabling Extreme-Scale Scientific Insight, Chapter 20, XP055602266, Oct. 25, 2012, pp. 73-85.

S. Li, et al., "Data Reduction Techniques for Simulation, Visualization and Data Analysis", Computer Graphics Forum, vol. 37, No. 6, XP055602247, 2018, pp. 422-447.

Lawrence Ibarria, et al., "Out-of-core compression and decompression of large *n*-dimensional scalar fields", Eurographics, vol. 22, No. 3, 2003, pp. 343-348.

Stefan Guthe, et al., "Real-time Decompression and Visualization of Animated Volume Data", IEEE Visualization, Oct. 21-26, 2001, pp. 9 pages.

John D. Villasenor, et al., "Seismic Data Compression Using High-Dimensional Wavelet Transforms", IEEE Proceedings of Data Compression Conference—DCC '96, 1996, pp. 396-405.

Shaomeng Li, et al., "Spatiotemporal Wavelet Compression for Visualization of Scientific Simulation Data", IEEE International Conference on Cluster Computing, 2017, pp. 216-227.

Aaron Trott, et al., "Wavelets Applied to Lossless Compression and Progressive Transmission of Floating Point Data in 3-D Curvilinear Grids", Proceedings of the 7th IEEE Visualization Conference (VIS'96), 1996, 4 pages.

"Simulia Introduction Training: Efficient training to learn new software: Introcourses for Abaqus, Isight, fe-safe, Tosca & 3DExperience Platform", Simuleon by Techna, https://www.simuleon.com/simulia-introduction-training/, Aug. 7, 2020, 15 pages.

"Complete Solutions for Realistic Simulation", Abaqus Unified FEA, Dassault Systèmes, https://www.3ds.com/products-services/simulia/products/abaqus/, Aug. 7, 2020, 4 pages.

"Computational Fluid Dynamics Simulation Software Improving Product Design & Development", Powerflow, CFD Software Solution for Aerodynamic Design—Dassault Systèmes, https://www.3ds.com/products-services/simulia/products/powerflow/, Aug. 7, 2020, 5 pages.

"Fluids Simulations to Improve Real-World Performance", Xflow, High Fidelity CFD—Dassault Systèmes, https://www.3ds.com/products-services/simulia/products/xflow/, Aug. 7, 2020, 4 pages.

Japanese Notice of Reasons for Refusal dated Oct. 3, 2023, in Japanese Application No. 2019-2259159 with English translation, citing documents 15-18 therein, 7 pgs.

\* cited by examiner

ADAPTIVE COMPRESSION OF SIMULATION DATA FOR VISUALIZATION

CROSS-REFERENCE TO RELATED APPLICATIONS

This application claims priority under 35 U.S.C. § 119 or 365 to European Application No. 18306832.9, filed Dec. 21, 2018. The entire contents of the above application(s) are incorporated herein by reference.

FIELD OF THE INVENTION

The disclosure relates to the compression and visualization of simulation data.

BACKGROUND

Simulations, such as physics simulations, usually require a huge computational power and have as well a high memory requirement. A common pipeline for displaying physics simulations is to compute the physics in a separate high-performance computer process and outputting simulation data to disk as the simulation advances in time. These data can be composed of the representation of the simulation at different time steps. The data is later exploited and rendered/displayed in an online and/or real-time way.

Physics simulations, for instance from the fields of aero-spatial, geomagnetism, electromagnetism or plasma physics, may require a huge amount of simulated data to be visualized. One example is Computational fluid dynamics (CFD). The latter is a branch of fluid mechanics that uses numerical methods and algorithms to solve and analyze problems that involve fluid flows. It is an essential tool in almost every branch of fluid dynamics, from aerospace propulsion to weather prediction. The special case of complex turbulent flow that frequently happens on nature and are important to be studied are a good example of simulations requiring fluid solver to have a high resolution and small time-steps, generating a large amount of spatio-temporal data. Transferring these data through a network can be a very time-consuming task, preventing to transfer a sequence of time steps in an interactive and/or real-time way. For this reason, one must find a way to compress the simulation data before sending it through the network.

Existing strategies for addressing this trend include in situ processing, decreasing temporal frequency, and reducing the size of the data to store. The latter approach can be done via subsampling, that is only storing pieces of simulation data, for example certain regions of the simulation mesh or certain variables but not all of them. It results in that only a partial, thus possibly physically non-accurate, view of simulation results is possible.

Reducing the size of the data to store can also involve compression. Most of the compression strategies rely on spatial information, but one can find some research on spatio-temporal data compression using wavelets filters targeting image data (for instance Villasenor, John D., R. A. Ergas, and P. L. Donoho. "Seismic data compression using high-dimensional wavelet transforms." Data Compression Conference, 1996. DCC'96. Proceedings. IEEE, 1996), surface meshes (for instance Trott, Aaron, Robert Moorhead, and John McGinley. "Wavelets applied to lossless compression and progressive transmission of floating point data in 3-D curvilinear grids." Proceedings of the 7th conference on Visualization'96. IEEE Computer Society Press, 1996.) and floating-point data from fluids simulation (for instance Li, Shaomeng, et al. "Spatiotemporal Wavelet Compression for Visualization of Scientific Simulation Data." Cluster Computing (CLUSTER), 2017 IEEE International Conference on. IEEE, 2017.) Compression has the disadvantage that it necessarily implies a loss of accuracy and precision, and that this loss cannot be controlled relatively to the physics. Consequently, displayed simulation results can be non-accurate from the physics point of view. Compression also has the disadvantage that zooming, e.g. on a simulation result, is limited to the compression ratio. Other compression techniques are known from video streaming and were explored for scientific data (for instance Ibarria, Lawrence, et al. "Out-of-core compression and decompression of large n-dimensional scalar fields." Computer Graphics Forum. Vol. 22. No. 3. Blackwell Publishing, Inc, 2003.). Even though these methods can be used to compress scientific data, they don't offer a reliable control on the numerical accuracy of the transferred data.

Also known is the use of post-processing techniques on computed simulation data for visualization. However, it requires the use of expensive and powerful super-computers.

Also, recent trends, especially on high-performance computers, show that computational power is increasing quickly, whereas disk speed are increasing slowly. As a result, simulation's ability to generate data is increasing faster than the ability to store and transfer data.

Within this context, there is still a need for an improved method for displaying a simulation.

SUMMARY OF THE INVENTION

It is therefore provided a computer-implemented method for displaying a simulation. The method comprises computing a full simulation. The full simulation comprises states. The method further comprises computing a reduced model of the computed full simulation. The reduced model comprises a basis with elements. Each state of the full simulation is represented by a respective linear combination of basis elements. The method further comprises displaying, for at least one state of the full simulation, a part of the respective linear combination.

This constitutes an improved method for displaying a simulation.

The method may comprise one or more of the following:
- any linear combination of basis elements is associated with a respective simulation compression ratio and a respective reconstruction error;
- the basis elements are ordered, and the first element of the ordered basis elements contributes to the part of the respective linear combination;
- the method further comprises, before the displaying of the part of the respective linear combination, selecting a number of basis elements contributing to the part of the respective linear combination for one or more next states to be displayed;
- the method further comprises, after the displaying of the part of the respective linear combination, the selecting of a new number of basis elements contributing to the part of the respective linear combination for one or more next states to be displayed, thereby creating a new part of the respective linear combination for each of the one or more states to be displayed. The method further comprises, after the displaying of the part of the respective linear combination, the displaying of the new part of the respective linear combination;
- the selecting of the new number of basis elements and the displaying of the new part are iterated;

each selecting is performed such that the respective simulation compression ratio or the respective reconstruction error of the part of the respective linear combination for one or more next states to be displayed reaches a given value;

the given value of the simulation compression ratio is determined so that an amount of data sent through a network for displaying the simulation is below a threshold;

the given value of the reconstruction error is determined so that an accuracy of the simulation to be displayed fits a requirement;

the given value is determined for displaying the simulation with a maximal accuracy while minimizing the amount of data sent through the network;

the threshold or the requirement are selected upon user action; and/or the computing of the full simulation and the computing of the reduced model of the computed full simulation are performed on a first computer, the other steps being performed on a second computer, the first and second computer being connected through a network.

It is further provided a computer program comprising instructions for performing the method.

It is further provided a computer readable storage medium having recorded thereon the computer program.

It is further provided a computer comprising a processor coupled to a memory and a display, the memory having recorded thereon the computer program.

It is further provided a system comprising a first computer connected to a second computer through a network, the first computer and the second computer each comprising a respective processor coupled to a respective memory, each memory having recorded thereon instructions for performing the method.

BRIEF DESCRIPTION OF THE DRAWINGS

Examples of the embodiments will now be described, by way of non-limiting example, and in reference to the accompanying drawings, where.

DETAILED DESCRIPTION OF THE INVENTION

Figure 1:
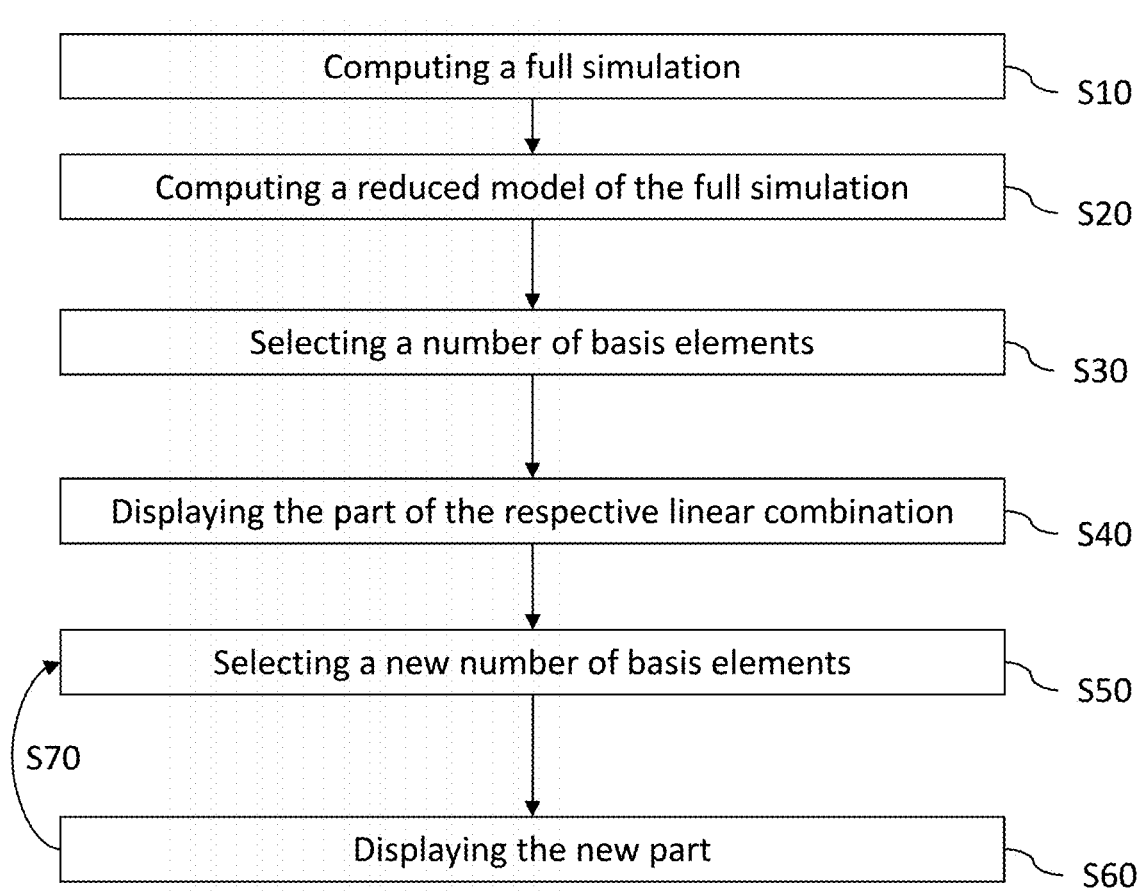
FIG. 1 shows a flowchart of an example of the method.

With reference to the flowchart of FIG. 1, it is proposed a computer-implemented method for displaying a simulation. The method comprises computing (S10) a full simulation. The full simulation comprises states. The method further comprises computing (S20) a reduced model of the computed full simulation. The reduced model comprises a basis with elements. Each state of the full simulation is represented by a respective linear combination of basis elements. The method further comprises, for at least one state of the full simulation, displaying (S40) a part of the respective linear combination.

Such a method improves the display of a simulation. Indeed, the reduced model of the computed full simulation captures the physics of the simulation. Thus, a relevant physics analysis can be performed based on the reduced model, such that a physically-interesting result (the part of the respective linear combination) is displayed. Thus, the simulation display respects a given accuracy level based on physics behavior and not only on numerical accuracy. Also, as only the part of the respective linear combination obtained from the reduced model is displayed, the simulation display requires a reduced amount of data to be transferred. The visualization data is thus adapted accordingly to the desired network usage, enabling the use low transfer rate networks. In short, the simulation display of the method is both economical in network usage and physically accurate. Furthermore, the full simulation is computed once and for all by the method, and then the method only replays/displays the full simulation, or at least a part of it, without rerunning the full simulation. The method further avoids video compression or post-processing techniques, and their disadvantages.

The method is computer-implemented. This means that steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined.

A typical example of computer-implementation of a method is to perform the method with a system (e.g. a computer system) adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (e.g. one for the program, and possibly one for the database).

Figure 2:
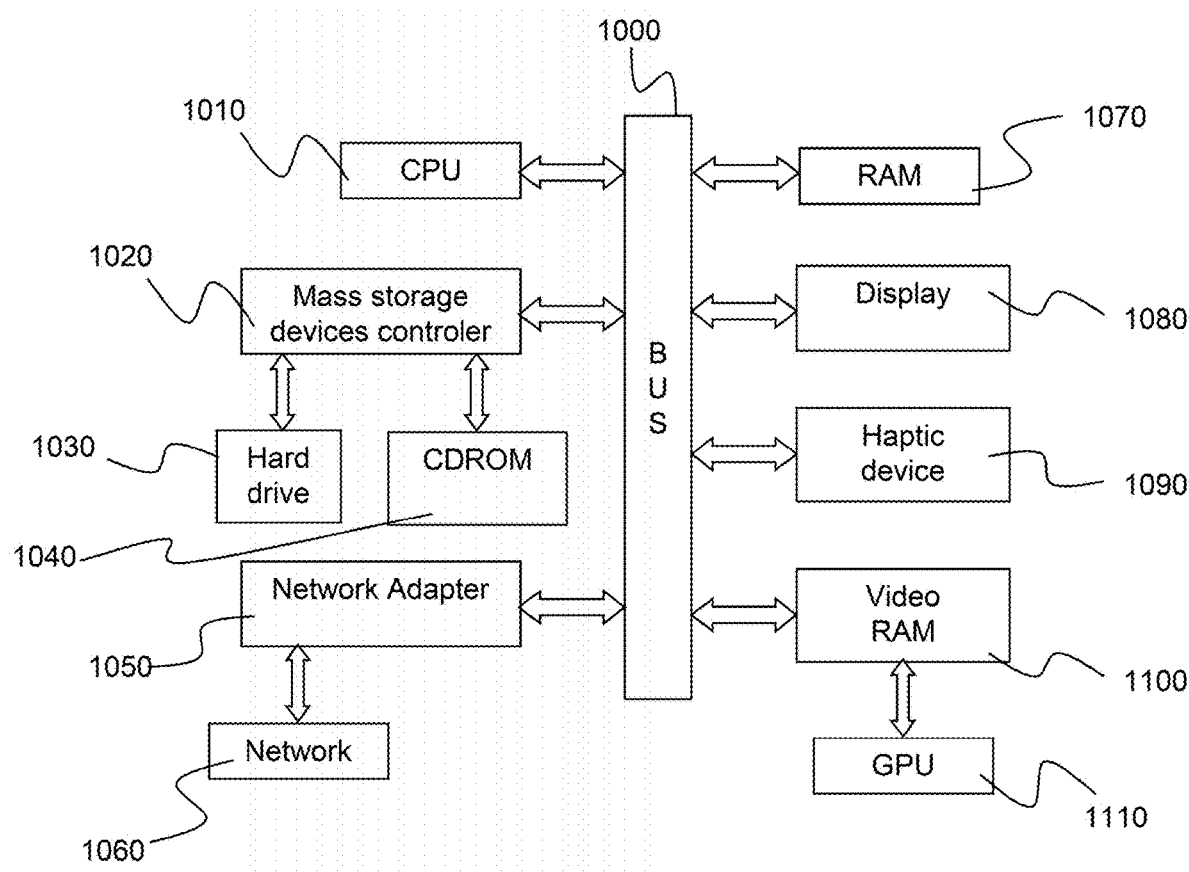
FIG. 2 illustrates an example of a computer of the embodiments.

FIG. 2 shows an example of the system, wherein the system is a client computer system, e.g. a workstation of a user.

The client computer of the example comprises a central processing unit (CPU) 1010 connected to an internal communication BUS 1000, a random-access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively, or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

In examples, the system comprises a first computer connected to a second computer through a network (also referred to as computer network), the first computer and the second computer each comprising a respective processor coupled to a respective memory, each memory having recorded thereon instructions for performing the method. In examples, the first computer is the client-computer system of FIG. 2. The computer network allows the first computer and the second computer to exchange resources, typically data, by using data links that are established over media such as wires or optic cables, or wireless media. More generally, any telecommunication network providing a data link can be used.

The system may be any combination of a CAD system, a CAE system, a CAM system, a PDM system and/or a PLM system. In those different systems, modeled objects are defined by corresponding data. A modeled object is any object defined by data stored e.g. in the database. By extension, the expression "modeled object" designates the data itself. According to the type of the system, the modeled objects may be defined by different kinds of data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system, as will be apparent from the definitions of such systems provided below.

By CAD system, it is additionally meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

By PLM system, it is additionally meant any system adapted for the management of a modeled object representing a physical manufactured product (or product to be manufactured). In a PLM system, a modeled object is thus defined by data suitable for the manufacturing of a physical object. These may typically be dimension values and/or tolerance values. For a correct manufacturing of an object, it is indeed better to have such values.

By CAM solution, it is additionally meant any solution, software of hardware, adapted for managing the manufacturing data of a product. The manufacturing data generally includes data related to the product to manufacture, the manufacturing process and the required resources. A CAM solution is used to plan and optimize the whole manufacturing process of a product. For instance, it can provide the CAM users with information on the feasibility, the duration of a manufacturing process or the number of resources, such as specific robots, that may be used at a specific step of the manufacturing process; and thus allowing decision on management or required investment. CAM is a subsequent process after a CAD process and potential CAE process. Such CAM solutions are provided by Dassault Systèmes under the trademark DELMIA®.

By CAE solution, it is additionally meant any solution, software of hardware, adapted for the analysis of the physical behavior of a modeled object. A well-known and widely used CAE technique is the Finite Element Method (FEM) which typically involves a division of a modeled object into elements which physical behaviors can be computed and simulated through equations. Such CAE solutions are provided by Dassault Systèmes under the trademark SIMULIA®. Another growing CAE technique involves the modeling and analysis of complex systems composed of a plurality components from different fields of physics without CAD geometry data. CAE solutions allow the simulation and thus the optimization, the improvement and the validation of products to manufacture. Such CAE solutions are provided by Dassault Systèmes under the trademark DYMOLA®.

PDM stands for Product Data Management. By PDM solution, it is meant any solution, software of hardware, adapted for managing all types of data related to a particular product. A PDM solution may be used by all actors involved in the lifecycle of a product: primarily engineers but also including project managers, finance people, sales people and buyers. A PDM solution is generally based on a product-oriented database. It allows the actors to share consistent data on their products and therefore prevents actors from using divergent data. Such PDM solutions are provided by Dassault Systèmes under the trademark ENOVIA®.

The method comprises computing (S10) a full simulation.

The simulation is any simulation from any field of physics, such as electronics, electricity, mechanics, electro-mechanics, fluid mechanics, gravitational mechanics, statistical mechanics, wave physics, statistical physics, particle systems, hydraulic systems, quantic physics, geophysics, astrophysics, chemistry, aerospatial, geomagnetism, electromagnetism, plasma physics or CFD. It may be the simulation of at least one behavior in time of any physics or multi-physics system from any fields of physics, including the above list of examples.

A physics or multi-physics system is any real-world system or physical entity whose behavior can be simulated via at least one (i.e. one or more) physics model from at least one field of physics (such as one of the above examples of physics fields). A real-world system or physical entity may be an electronic product, and electrical product, a mechanical product, an electromechanical product, a system of particles or an electromagnetic product. A physics model may be an electronical model, an electrical model, a mechanical model, a statistical model, a particle model, a hydraulic model, a quantic model, a geological model, an astronomic model, a chemical model, an electromagnetic model or a fluid model. A physics model may be a system of one or more equations, such as one or more differential equations and/or partial differential equations and/or algebraic equations. A multi-physics system generally has subsystems that are themselves physics or multi-physics systems and that are altogether connected by physics or logics relations, e.g. given by physics laws. A multi-physics system is thus a model to represent real world system or any physical entity having sub-systems related together by physical or logical relations, such as mechanical relations (e.g. corresponding to connections for transmitting a force or movement), electrical relations (e.g. corresponding to electrical connections, for example in a circuit), hydraulic relations (e.g. corresponding to conducts that transmit fluxes), logical relations (e.g. corresponding to flows of information), fluid relations (e.g. corresponding to a fluid flow), chemical relations and/or electro-magnetic relations. The system is called "multi-physics" because the physical or logical relations of a multi-physics system can belong to several fields of physics (although this is not necessary the case). An example of multi-physics system is a CFD system comprising an airplane wing and at least one airplane engine attached to the airplane wing.

A physics or multi-physics system may correspond to an industrial product to be manufactured in the real world subsequent to the completion of its virtual design, such as a (e.g. mechanical) part or assembly of parts, or more generally any rigid body assembly (e.g. a mobile mechanism), rigid body mechanism. A CAD and/or CAE software solution allows the design of products in various and unlimited industrial fields, including: aerospace, architecture, construction, consumer goods, high-tech devices, industrial equipment, transportation, marine, and/or offshore or transportation. A multi-physics system thus represents an industrial product which may be a part (or the whole) of a terrestrial vehicle (including e.g. car and light truck equipment, racing cars, motorcycles, truck and motor equipment, trucks and buses, trains), a part (or the whole) of an air vehicle (including e.g. airframe equipment, aerospace equipment, propulsion equipment, defense products, airline equipment, space equipment), a part (or the whole) of a naval vehicle (including e.g. navy equipment, commercial ships, offshore equipment, yachts and workboats, marine equipment), a mechanical part (including e.g. industrial manufacturing machinery, heavy mobile machinery or equipment, installed equipment, industrial equipment product, fabricated metal product, tire manufacturing product), an electro-mechanical or electronic part (including e.g. consumer electronics, security and/or control and/or instrumentation products, computing and communication equipment, semiconductors, medical devices and equipment), a consumer good (including e.g. furniture, home and garden products, leisure goods, fashion products, hard goods retailers' products, soft goods retailers' products), a packaging (including e.g. food and beverage and tobacco, beauty and personal care, household product packaging).

The simulation may be the simulation of at least one industrial product to be manufactured in the real-world, of which design has already been performed. The simulation may simulate at least one behavior (e.g. an evolution in time) of the at least one industrial product subsequent to its design. The method may be followed by the manufacturing in the real-world of the at least one industrial product subsequent to its simulation by the method.

Simulating a physics or multi-physics system modelized by at least one physics model generally comprises computing an approximation of a physical behavior in time (e.g. an evolution in time) of the system by computing the at least one physics model and/or storing the results and/or displaying the results. Computing the at least one physics model may be preceded by the providing of at least one grid (or mesh) and/or at least one time step and/or at least one simulation parameter. Said providing may be carried out upon user action. The computing generally (but not always) includes discretizing the one or more equations of the at least one physics model according to the at least one grid and/or the at least one time step. The discretizing may be done by using any known numerical method.

The simulation comprises simulation states (which will be referred as "states" in the following, for the sake of simplicity). A state is a representation, at a given time, of a physics state of a physics system of which a behavior in time is simulated by the simulation. For instance, a physics state may be any physics quantity at a given time. A physics quantity (also referred to as physical quantity) is a physical property of a phenomenon, body, or substance, that can be quantified by measurement. A physical quantity may be, but is not limited to, Length, Mass, Time, Electric current, Temperature, Amount of substance, Luminous intensity, Absement, Absorbed dose rate, Acceleration, Angular acceleration, Angular momentum, Angular speed (or angular velocity), Area, Area density, Capacitance, Catalytic activity, Catalytic activity concentration, Chemical potential, Crackle, Current density, Dose equivalent, Dynamic viscosity, Electric charge, Electric charge density, Electric displacement, Electric field strength, Electrical conductance, Electrical conductivity, Electric potential, Electrical resistance, Electrical resistivity, Energy, Energy density, Entropy, Force, Frequency, Fuel efficiency, Half-life, Heat, Heat capacity, Heat flux density, Illuminance, Impedance, Impulse, Inductance, Irradiance, Intensity, Jerk, Jounce (or snap), Kinematic viscosity, Linear density, Luminous flux (or luminous power), Mach number (or mach), Magnetic field strength, Magnetic flux, Magnetic flux density, Magnetization, Mass fraction, (Mass) Density (or volume density), Mean lifetime, Molar concentration, Molar energy, Molar entropy, Molar heat capacity, Moment of inertia, Momentum, Permeability, Permittivity, Plane angle, Power, Pressure, Pop, (Radioactive) Activity, (Radioactive) Dose, Radiance, Radiant intensity, Reaction rate, Refractive index, Reluctance, Solid angle, Speed, Specific energy, Specific heat capacity, Specific volume, Spin, Strain, Stress, Surface tension, Temperature gradient, Thermal conductivity, Torque, Velocity, Volume, Volumetric flow, Wavelength, Wavenumber, Wavevector, Weight, Work, Young's modulus. A state may also be a vector of physics quantities. The simulation comprises an initial time and a final time, and at least one (i.e. one or more) time step that is/are comprised between the initial time and the final time. There is one state for each time step, including the initial time and the final time.

Figure 3:
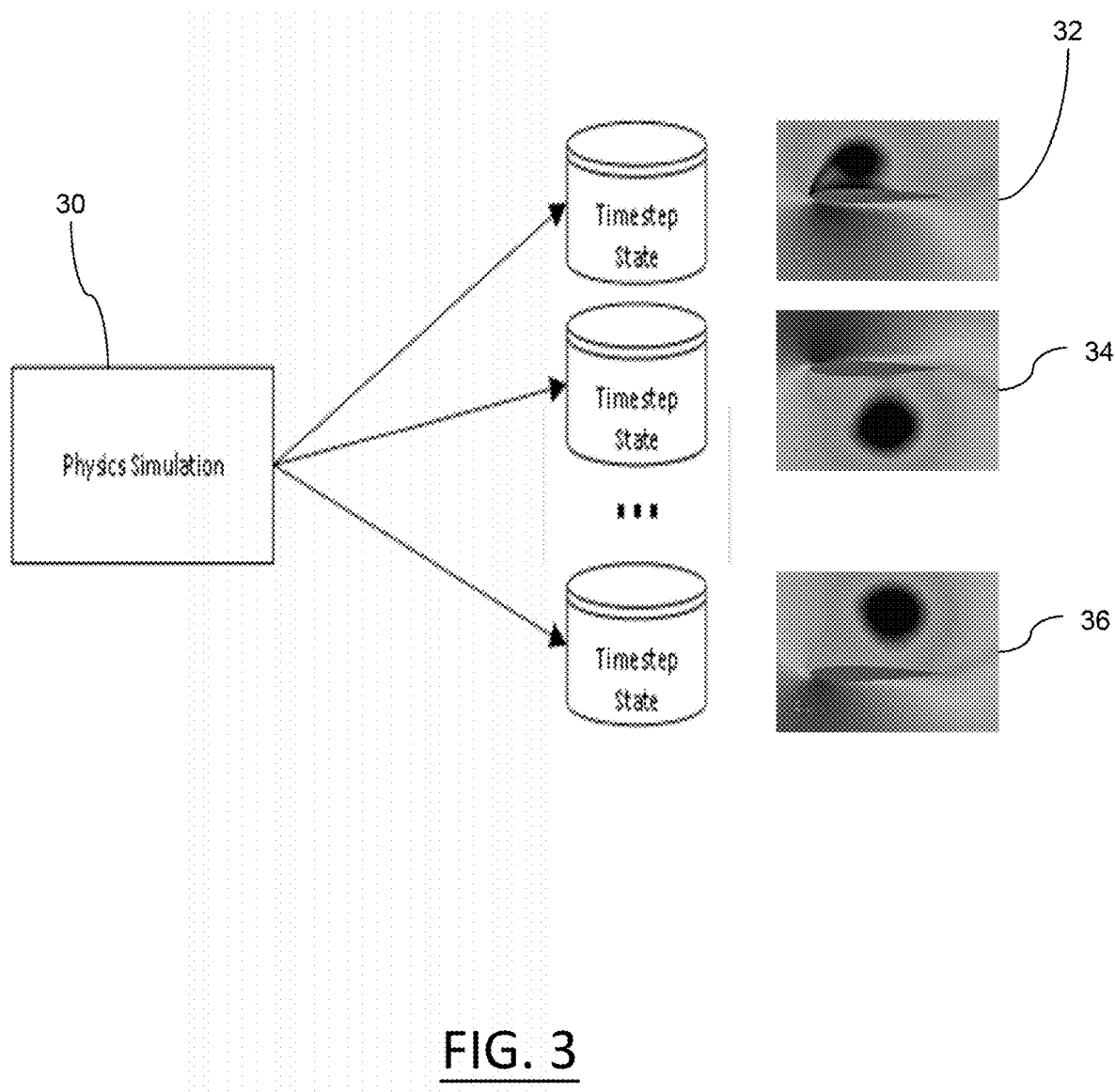
FIG. 3 shows a diagram illustrating an example of a full simulation.

Computing the full simulation means that all simulation results are computed, a simulation result being the data containing information representing a state. Thus, computing the full simulation means that substantially all the information representing all states at all times is computed. The full simulation can be computed by using any known numerical method and/or any existing computer program that is able to export simulation results at different time steps. FIG. 3 shows a diagram illustrating an example of a full simulation. The full simulation 30 is a physics simulation. The full simulation 30 comprises n states 32, 34, 36.

The method further comprises computing (S20) a reduced model of the computed full simulation.

A reduced model of a computed full simulation is a model computed from the simulation by using Reduced order Modeling techniques. Reduced order Modeling (ROM) techniques are techniques that reduce the dimensionality and computational complexity of mathematical models. A ROM (hereinafter, reduced model) is built from high-fidelity simulations (e.g. computed full simulations) and can subsequently be used to generate simulations for lower computation. One example of ROM methods is Galerkin projection (see for instance Rowley, Clarence W., Tim Colonius, and Richard M. Murray. "Model reduction for compressible flows using POD and Galerkin projection." Physica D: Nonlinear Phenomena 189.1-2 (2004): 115-129. and Barone, Matthew F., et al. "Reduced order modeling of fluid/structure interaction." Sandia National Laboratories Report, SAND No 7189 (2009): 44-72.), which is particularly popular for fluid dynamics. The Galerkin projection method uses Proper Orthogonal Decomposition (POD) to reduce the dimensionality of flow simulations and then finds the dynamics on this reduced space. There are other methods that build on this such as reduced basis methods and balanced truncation (see for instance Veroy, K., and A. T. Patera. "Certified real-time solution of the parametrized steady incompressible Navier—Stokes equations: rigorous reduced-basis a posteriori error bounds." International Journal for Numerical Methods in Fluids 47.8-9 (2005): 773-788. And Rowley, Clarence W. "Model reduction for fluids, using balanced proper orthogonal decomposition." Modeling And Computations In Dynamical Systems: In Commemoration of the 100th Anniversary of the Birth of John von Neumann. 2006. 301-317.). Generally speaking, ROM computes a basis from states of a computed full simulation using techniques such as POD or Single Value Decomposition (SVD). This basis represents the main components of the simulation. The SVD provides a way to factorize a matrix into singular vectors and singular values. The SVD allows discovery of some of the same kind of information as the eigen decomposition and can for instance represent the main components of a mechanical system. Also known is "Model Order Reduction", Francisco Chinesta, Antonio Huerta, Gianluigi Rozza and Karen Willcox, Encyclopedia of Computational Mechanics, edited by Erwin Stein, Rene de Borst and Thomas J. R. Hughes, 2004. The computing of the reduced model according to the method uses any techniques of ROM, such as the ones described in the references hereabove.

In any case, the computed reduced model comprises a basis with elements. The basis may be called a reduced basis. These elements of the basis will be called basis elements hereinafter. Each state of the computed full simulation is represented by a respective linear combination of basis elements. The respective linear combination is thus also called a state representation of the state it represents. The respective linear combination may also be called a reduced state of the state it represents. In other words, for each state of the computed full simulation, the method computes a representation of this state. The computed representation is a vector belonging to the vector space spanned by the basis elements, the basis being a vector basis of said vector space. A basis element is a component of the factorization computed from the computed full simulation. A basis element may also be called a mode. In examples, the basis elements are energy modes of a physics system simulated by the simulation. Each state representation approximates the state it represents.

The basis may be written $B=(e_1; e_2; \ldots e_n)$, where the $e_i$ are the basis elements. Any state state(t) can be represented at time t by its state representation PState(t) that is a linear combination of these basis elements as follows:

$$PState(t) = w_1(t)*e_1 + w_2(t)*e_2 + \ldots + w_n(t)*e_n \quad \text{(formula (1))}.$$

Here, the $w_i$ are the weights of the contribution of each basis elements used to compute the state representation PState(t). Saying that a basis element contributes to a linear combination is saying that the its contribution weight is non-zero in the linear combination. The basis B is kept constant over time, and only the weights may evolve in time. Updating the weights in time makes the simulation results advance in time. Computing the reduced model of the computed full simulation includes computing all elements of the basis B and all weights at all times t that are time steps comprised between the initial time and the final time of the simulation. Thus, once the reduced model is computed, any reduced state PState(t) representing any state state(t) of the computed full simulation at any time step t is available, by using formula (1).

Figure 4:
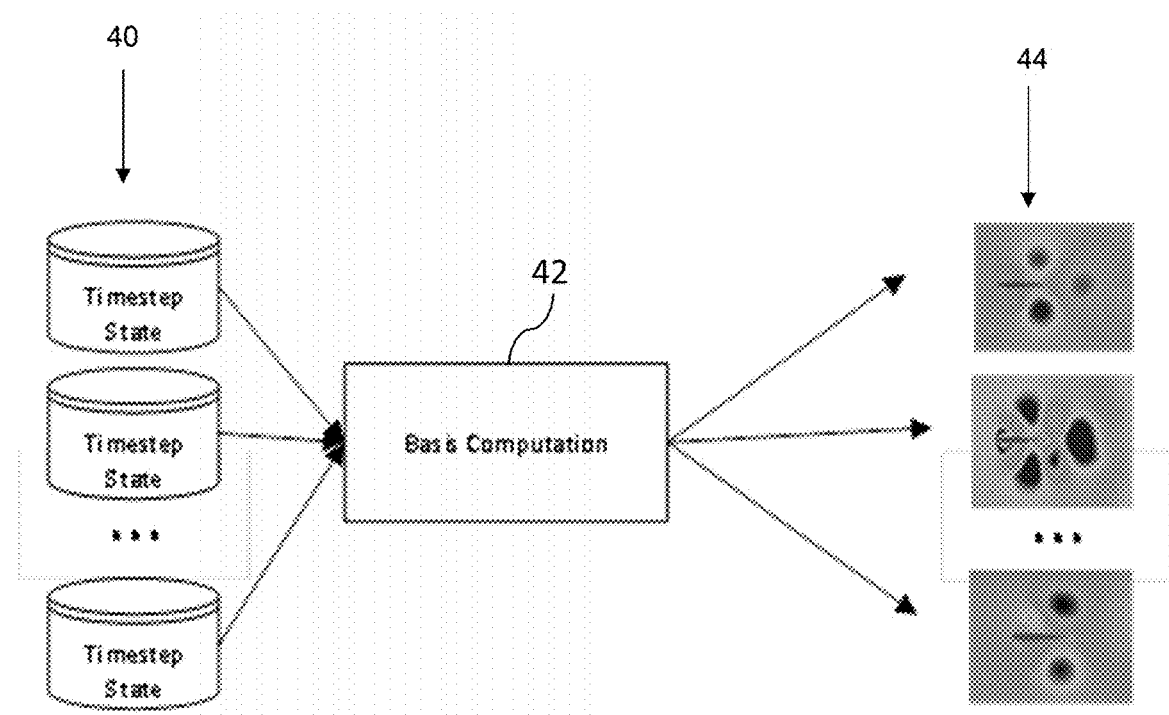
FIG. 4 shows a diagram illustrating an example of the computing of the reduced model.
Figure 5:
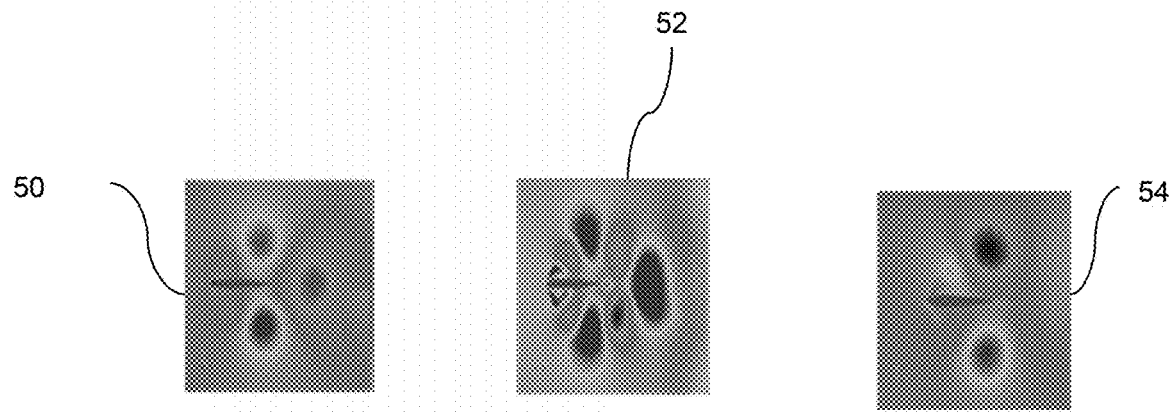
FIG. 5 shows examples of basis elements.

FIG. 4 is a diagram illustrating an example of the computation of the reduced model. The computation takes as inputs the states 40 of the computed full simulation at all time steps of the full simulation. The computation includes the computation 42 of the basis, which is based on all the states 40 of the computed full simulation. In the example of FIG. 4, the computed basis is a basis of modes 44 of the computed full simulation. In other words, the basis elements are in this example the result of the factorization of the computed full simulation. Three screenshots of snapshots 50, 52 and 54 are illustrated in FIG. 5.

The method further comprises displaying (S40), for at least one (that is one or more) state of the full simulation, a part of the respective linear combination. Thus, the displaying can be for one state. It can also be for several states, which can be displayed simultaneously or successively, for instance according to an iteration in time. A part of the respective linear combination representing a state may be called a state approximation or a full state approximation.

In other words, the method comprises the following: for at least one time step t of the full simulation, the method displays a part of the linear combination forming the state representation PState(t) of a state state(t) at time t. A part of a linear combination means the linear vector projection of said linear combination onto the vector space spanned by a sub-family of the basis elements contributing to the linear combination. For instance, take the state representation PState(t) of a state state(t) at time step t, given by formula (1). A part of the linear combination forming PState(t) is the following:

$$w_{n_1}(t)*e_{n_1}+w_{n_2}(t)*e_{n_2}+\ldots+w_{n_p}(t)*e_{n_p} \quad \text{(formula (2))},$$

where $[\ln_1, n_2, \ldots, n_p|]$ is a non-empty subset of $[|1, 2, \ldots, n|]$, p being a positive integer, the $e_i$ are the basis elements discussed in relation with formula (1), and $w_i$ are the weights of the contribution of each basis elements discussed in relation with formula (1). A subset of a set is to be understood in its mathematical meaning: it can be a part of the set or all the set. With these notations, the above means that, for at least one time step t, the method displays the part given by formula (2) of the respective linear combination forming the state representation PState(t). The methods may do such a displaying for several more time steps, for instance simultaneously or successively. It should be noted that, the more there are basis elements contributing to the part of the respective linear combination that is displayed, the more accurate the display is, and the larger the data volume necessary for simulation display is. In other words, the larger p is, the more accurate and costlier the display of the simulation is.

In examples, several parts of linear combinations representing all simulation states are displayed simultaneously. In these examples, the full simulation is reconstructed based on a combination that includes said several parts. Reconstructed means that an approximation (thus costless in data) of the full simulation is created based on the combination. The reconstructed full simulation may be displayed at the displaying (S40) as well.

In examples, any linear combination of basis elements is associated with a respective simulation compression ratio and a respective reconstruction error.

The computed reduced model provides a set of linear combinations that can be used for simulation display. Each one of these linear combinations is associated with a respective simulation compression ratio, and as such they are in direct connection with the amount of data that is necessary for simulation display. To a value of a compression ratio corresponds indeed an amount of transferred data, and the larger the amount of data is, the smaller the value of the compression ratio is. In other words, displaying a part of one respective linear combination means to determine a certain amount of data to be transferred for simulation display. Also, since each one of these linear combinations is associated with a respective reconstruction error, they are in direct connection with the accuracy of the simulation display. In other words, displaying a part of one respective linear combination implies fixing/requiring a certain accuracy, a certain quality, of the simulation display. It also means that the amount of data and the accuracy are related: the larger the amount of data is, the better the accuracy is, and vice-versa.

The respective reconstruction error of a respective linear combination of basis elements is a mathematical comparison between the state approximation formed by the respective linear combination or, where appropriate, the part of the respective linear combination, and the respective state that the state approximation represents and approximates.

In examples, the error is computed as follows. Take a time step t, the state state(t) at this time step, and its state representation PState(t) given by formula (1). The respective reconstruction error associated with the linear combination PState(t) is then given by $$\|\text{state}(t)-\text{PState}(t)\|, \quad \text{(formula (3))}$$

where $\|\cdot\|$ is any suitable known norm. Similarly, take a part of the linear combination PState(t) given by formula (2), then the error associated with the part is $$\|\text{state}(t)-wn1(t)*en1+wn2(t)*en2+\ldots+wnp(t)*enp\|. \quad \text{(formula (4))}$$

The parameters in formulae (3) and (4) are those discussed in reference to formulae (1) a (4), The more there are basis elements in a linear combination, the smaller its respective reconstruction error is, and the more accurate the result of displaying the linear combination is.

In examples where a part of the respective linear combination is displayed for several states, the method may comprise the computation of the sum of all squares of all the respective reconstruction errors associated with all the displayed parts of respective linear combinations. The computed sum provides a common error of all the displayed parts of respective linear combinations. For instance, assume that state representations $PState(t_1), PState(t_2), \ldots, PState(t_m)$ of states $state(t_1), state(t_2), \ldots, state(t_m)$ at time steps $t_1, t_2, \ldots, t_m$ are displayed. Then the common error is $$\frac{1}{m}\sum_{i=1}^{m}\|\text{state}(t_i) - PState(t_i)\|^2. \quad \text{(formula (5))}$$

Similarly, when considering the parts of the state representations $PState(t_1), PState(t_2), \ldots, PState(t_m)$ given by formula (2) (applied with $t=t_1, t_2, \ldots, t_m$), the common error is written $$\frac{1}{m}\sum_{i=1}^{m}\|\text{state}(t_i) - (w_{n1}(t_i)*e_{n1} + w_{n2}(t_i)*e_{n2} + \ldots + w_{np}(t_i)*e_{np})\|^2. \quad \text{(formula (6))}$$

The respective compression ratio is a ratio between the amount of data to be transferred for displaying a state state (t) and the amount of data to be transferred for displaying the respective linear combination forming the state representation PState(t) approximating and representing the state state (t), for instance according to formula (1). Where appropriate, the respective compression ratio is a ratio between the amount of data to be transferred for displaying the state state (t) and the amount of data to be transferred for displaying a part the respective linear combination forming PState(t), for instance according to formula (2). The more there are basis elements in a linear combination, the smaller its respective reconstruction error is, and the larger the volume of data to be transferred for displaying the linear combination is. Inversely, the less there are basis elements in a linear combination, the larger its respective reconstruction error is, and the smaller the volume of data to be transferred for displaying the linear combination is.

Figure 6:
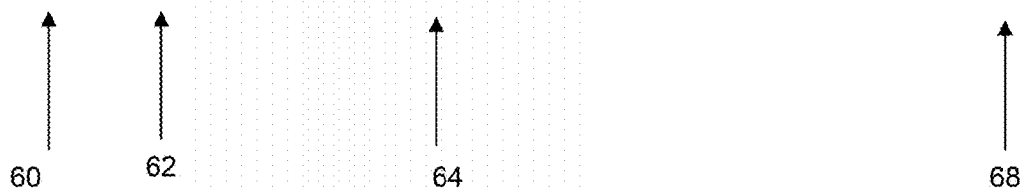
FIG. 6 illustrates different reconstruction errors associated with different respective parts of the linear combination forming state representations of one state.

FIG. 6 illustrates different reconstruction errors associated with different respective parts of the linear combination forming state representations of one state. In column 60 are the number of basis elements contributing to the different part of the linear combination. In column 62 are the respective simulations errors associated with each part. In column 64, the respective different parts of the linear combination are displayed. In column 68, said one state is displayed repeatedly for the purpose of comparison. As shown in FIG. 6, the more there are basis elements contributing to the part, the smaller the respective reconstruction error is, and the more accurate the approximation of the state is. The example of FIG. 6 thus shows the influence of the number of modes in the reconstruction error.

In examples, the basis elements are ordered. In these examples, the first element of the ordered basis elements contributes to the part of the respective linear combination that is displayed.

Ordering the basis elements and requiring that at least the first element contributes to the part of the linear combination allows guaranty of a minimal accuracy for the simulation display.

Ordering the basis elements means that the base, as above, can be written $B=(e_1; e_2; \ldots e_n)$, but also that $e_1$ is the first element, $e_2$ the second, etc. ... and $e_n$ the last. In other words, the basis elements are indexed, and the indexation gives the order. In examples, the order is linked with the accuracy of time display: if the first element is the only basis element that contributes to the part of the linear combination, then the part of the linear combination has a respective reconstruction error that is smaller than the respective reconstruction error of the part of the linear combination where only the second basis element contributes, which itself has a respective reconstruction error that is smaller than the respective reconstruction error of the part of the linear combination where only the third basis element contributes, and so on. For instance, if a state state(t) at time step t is represented by PState(t) given by formula (1), then for all integers $1 \leq p \leq q \leq n$, $$\|state(t)-w_p(t)e_p\| \leq \|state(t)-w_q(t)e_q\|. \quad \text{(formula (7))}$$

This holds independently of the time step t. In other words, the order of basis elements follows their incremental accuracy for simulation display.

The method may further comprise, before the displaying (S40) of the part of the respective linear combination, selecting (S30) a number of basis elements contributing to the part of the respective linear combination for one or more next states of the simulation to be displayed.

Selecting the number of basis elements affects both the accuracy and the cost of the display of the one or more next states. It may increase or reduce the respective reconstruction errors or the respective simulation compression ratios for the next states. In other words, the selecting allows control of both the accuracy of the display and the amount of data to be transferred for the display, thus allowing the control of the network necessary for simulation display while ensuring a certain display accuracy.

Selecting (S30) the number of basis elements means that any part of any linear combination that is concerned by the selecting (S30) will feature a number of contributing basis element that is exactly the selected number. The expression one or more next states refers to the at least one state for which the displaying (S40) is carried out by the method. It means that the selecting (S30) can be performed for one, a part of, or all the states of the at least one state. In examples, the selecting (S30) is performed once for all states of the at least one state, which means that the same number of basis elements contribute to all parts of the respective linear combinations representing each state of the at least one state. In these examples, it may be exactly the same basis elements that contribute. The selecting (S30) can be carried out automatically, or upon a user action.

In examples, the basis elements are ordered, and the first basis element always contributes to any part of any linear combination that is displayed. In these examples, selecting a number, say N, of elements, may result in that the N first basis elements contribute to any part of any linear combination that is displayed.

The method may further comprise, after the displaying (S40) of the part of the respective linear combination, the selecting (S50) of a new number of basis elements contributing to the part of the respective linear combination for one or more next states to be displayed. Thereby a new part of the respective linear combination is created for each of the one or more states. The method may further comprise the displaying (S60) of the new part of the respective linear combination.

The method allows incremental accuracy, which means that the information is cumulative. If the accuracy of the previous displaying (S40) is not satisfying from the physics point of view, the number of elements contributing to the part of the linear combination may be increased, so as to reach a satisfying accuracy. Similarly, the method allows to avoid network bottleneck. Suppose that the amount of data to be transferred for the previous displaying (S40) causes, or encounters, a network bottleneck. Then the number of elements contributing to the part of the linear combination may be reduced, so as to ease the network usage and/or economize the use of the bandwidth. Similarly, the method allows to avoid bottleneck on the computer system that carries out the simulation, e.g. the simulation uses too much computing resources and/or memory and/or overwhelm other elements of the computer system such as storage, bus, etc. . . . . The number of elements contributing to the part of the linear combination may be reduced, so as to decrease computer system usage.

The selecting (S50) of the new number may be performed as the previous selecting (S30).

In examples, the basis elements are ordered, and the first basis element always contributes to any part of any linear combination that is displayed. In these examples, the number, say N, of elements selected at the previous selecting (S30) may result in that the N first basis elements contribute to any part of any linear combination that is displayed. Selecting (S50) a new number, say M, of elements includes adding or removing one or more basis elements from the N first basis elements already contributing, such that it is the M first basis elements that will now contribute to the new part of the respective linear combination for each of the one or more states of the simulation to be displayed.

In examples, the selecting (S50) of the new number of basis elements and the displaying (S60) of the new part are iterated (S70).

The method is thus very flexible. Indeed, the number of basis elements contributing to the displayed part(s) can be modified during time, e.g. during the simulation time. Thus, the accuracy of the simulation display as well as the network usage can always be updated or changed. This allows for a simulation display that is as accurate as possible while taking account, in real-time, of the bandwidth and/or use and/or possible bottlenecks and acting in consequence to ease the network/bandwidth use (by performing a new selecting (S50)). Notably, the method is well suited for being executed automatically, for instance for displaying automatically and in real-time a series of simulation results, e.g. the time sequence of all states, as accurately as possible, while respecting automatically and in real-time the constraints of the network/bandwidth use. In other words, the method may automatically and in real-time adapt the display accuracy to the available network.

The length/duration time of the iteration may be predetermined. It may for instance correspond to the simulation length. In examples, each increment of the iteration corresponds to one time step of the simulation. In these examples, the following may occur: all states are displayed successively in the order of their position in time during the simulation. It means that at each time step of the simulation, the corresponding part of a linear combination representing the state of this time step is displayed. It results that approximations of states are displayed in their order in time. This may be done continuously, such that an approximation of the full simulation is displayed continuously, allowing for instance to watch the evolution in time of a simulated physics system.

A selecting (S50) is performed before each displaying (S70). The iteration (S70) may be performed automatically by a computer. For instance, the computer may be provided in real-time with measurements of the network usage, and then carry out each selecting (S50) such that the amount of data for simulation display does not cause a network bottleneck when the next display is performed. The iteration (S70) may also involve a user interaction with the computer. In examples, the user may perform each selecting (S50) of the iteration (S70), for instance by interacting with a GUI of a computer. If the next displaying (S70) does not suit the user, for instance if a certain requirement of accuracy is not reached, the user may carry out the next selecting (S50) so as to increase the number of contributing basis elements. In examples, the user is provided with measurements of the network usage at each displaying (S60) and may thus perform the next selecting (S50) so as to increase or decrease the number of contributing basis elements, for instance to avoid bottlenecks.

In examples where any linear combination of basis elements is associated with a respective simulation compression ratio and a respective reconstruction error, each selecting (S50) may be performed such that the respective simulation compression ratio of the part of the respective linear combination for one or more next states to be displayed reaches a given value. Alternatively, each selecting (S50) may be performed such that the respective reconstruction error of the part of the respective linear combination for one or more next states to be displayed reaches a given value.

By setting a value to reach for the simulation compression ratio or the reconstruction error, the method ensures a balance between display accuracy and transfer speed (thus network usage).

The given value of the simulation compression ratio (resp. the reconstruction error) is a value of compression ratio (resp. reconstruction error) that is determined (e.g. predetermined or selected by a user) so as to ensure a given transfer speed (resp. a given accuracy).

To reach the given value of the simulation compression ratio (resp. the reconstruction error), each selecting (S50) comprises an iteration of the following:
  the respective simulation compression ratio (resp. the reconstruction error) of the one or more next part of respective linear combinations to be displayed is determined based on the current number of contributing basis elements,
  the respective simulation compression ratio (resp. the reconstruction error) of the one or more next part of respective linear combinations to be displayed is compared with the given value,
  if the respective simulation compression ratio (resp. the reconstruction error) of the one or more next part of respective linear combinations to be displayed and the given value are not substantially equal, a new number of basis elements is selected (S50), and so on, until the respective simulation compression ratio (resp. the reconstruction error) of the one or more next part to be displayed is substantially equal to the given value.

In examples, the above iteration comprises only one increment, which means that the selected new number directly leads to the substantial equality between the respective simulation compression ratio (resp. the reconstruction error) of the one or more next part of respective linear combinations to be displayed and the given value. In these examples, the given value is thus reached in a one-shot computation. It is to be understood that the given value may be the same for each selecting (S50) or may be changed during execution of the method, for instance at some selecting (S50) or at each of them.

The given value of the simulation compression ratio may be determined so that an amount of data sent through a network for displaying the simulation is below a threshold.

Ensuring that the amount of data stays below a threshold implies that priority is given to the network usage. In short, the method offers the maximal display accuracy that respects the constraint that the amount of data that can be transferred is limited by the threshold.

The network has a network load, which corresponds to the amount of data currently transferred through the network. The network load is typically measured in bits per second. The network load comprises at least the data of the simulation that is sent for displaying the simulation, and it may additionally comprise data of other type of traffic. Requiring that the amount of data (e.g. a data volume) sent through the network for displaying the simulation stays below a threshold is to require that the corresponding network load does not exceed a given network load; in all cases the network load that corresponds to the amount of data sent through the network for displaying the simulation should not excess the maximal network load the network can bear. The threshold may be fixed by a user. The threshold may be determined automatically by a computer based on measurements on the network; the maximal network load and the current network load (e.g. the current network usage is measured) being measured, the difference provides the available network load for the data of the simulation and can be the threshold. As explained above, a compression ratio corresponds to an amount of data. Thus, the requirement that the amount of data stays below a threshold is to require that the compression ratio stays above a certain value, that corresponds to the threshold. Determining the given value of the simulation compression ratio so that the amount of data sent through a network for displaying the simulation is below a threshold and reaching the given value at the selecting (S50) means that simulation compression ratios of displayed parts of respective linear combinations are such that the network load for displaying the simulation does not cause the maximal network load to be reached.

The given value of the reconstruction error may be determined so that an accuracy of the simulation to be displayed fits a requirement.

Ensuring that the display accuracy fits a requirement means that priority is given to the display accuracy. In short, the method aims at maximizing the display accuracy.

Saying that the display accuracy fits a requirement means that the error(s) of displayed the part(s) (where appropriate, the common error) stays below a maximal error value. Indeed, the larger the reconstruction error value of a part is, the less the accuracy of the part display is. The maximal error value may be predetermined, for instance by a user. The given value of the reconstruction error may be determined as a result of setting the maximal error value, and such that it is lower that the maximal error value. Thus, the requirement of accuracy is set in function of the maximal error value. As such, determining the given value of the reconstruction error and performing the selecting (S50) so that the given value is reached implies that the error (where appropriate, the common error) of all displayed parts stays below the maximal error value.

In examples, the given value is determined for displaying the simulation with a maximal accuracy while minimizing the amount of data sent through the network.

Such a determination of the given value optimizes the balance between accuracy and transfer speed.

Determining the given value so that display accuracy is maximal while minimizing the amount of data means that the network is used as extensively as possible, but with the requirement that the network load stays below a maximal network load. In other words, the amount of data send through the network is such that the network load is substantially equal to the maximal network load. Thus, the amount of data sent for reaching the maximal possible display accuracy is minimized. In terms of basis elements, it means that the number of contributing basis elements of the displayed part(s) is as large as possible but satisfies the constraint that the reached given value of the compression ratio is such that the network load is substantially equal to the maximal network load.

In examples, the threshold may be selected upon user action.

In examples, the requirement may be selected upon user action.

In these examples, the user has thus a control of the display accuracy and/or the bandwidth/network usage.

The selection may be performed at an initial stage of the method; in which case the threshold or the requirement is common to all selecting (S50). It can also be carried out at any time during the execution of the method, for instance at any increment of an iteration of the selecting (S50) and the displaying (S60), where appropriate. The selection may further be carried out upon user interaction with a GUI of a computer.

Different examples of the method will now be discussed with reference to FIGS. 7-10.

Figure 7A:
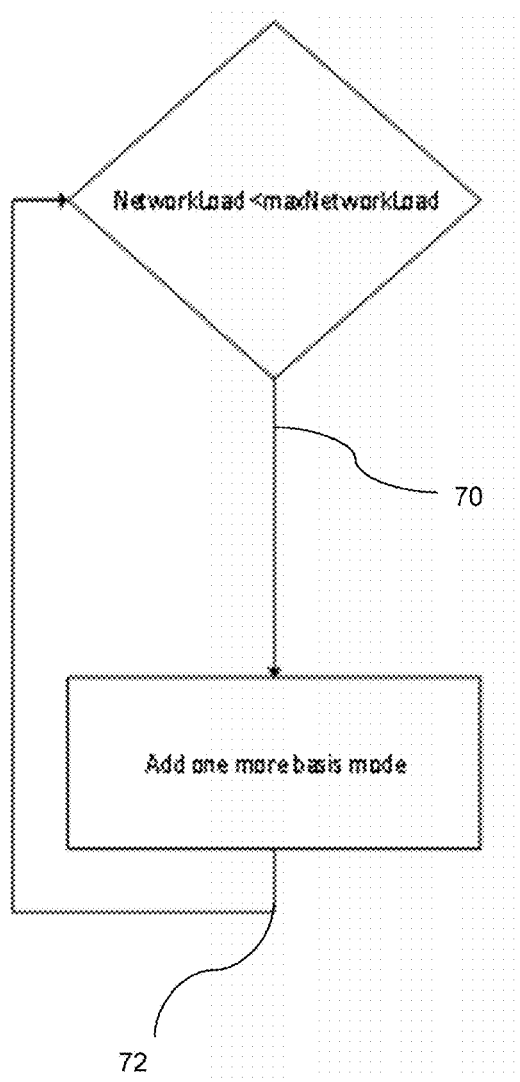
FIGS. 7a and 7b show diagrams illustrating examples of one selecting performed to reach the given value.
Figure 7B:
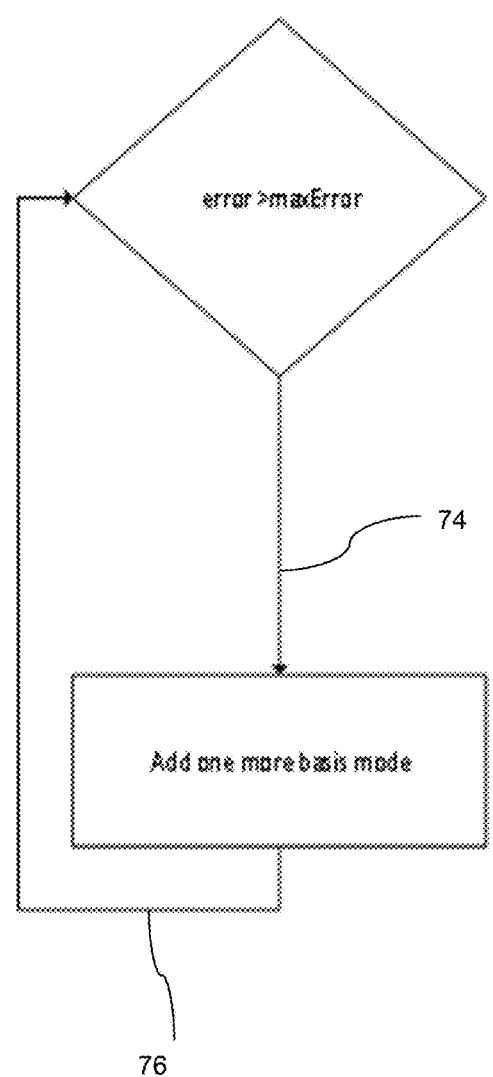

FIGS. 7a and 7b show diagrams illustrating examples of one selecting (S50) performed to reach the given value.

In one example of FIG. 7a, the given value of the simulation compression ratio is determined so that the network load corresponding to the amount of data transferred for simulation display equals a maximal network load. The maximal network load may be selected automatically by a computer or upon user action. The maximal network load is such that the corresponding amount of transferred data is below a threshold. A detection 70 of the current number of basis elements contributing to the part(s) of respective linear combinations to be displayed is carried out. The respective simulation compression ratio of the part(s) of respective linear combinations is computed as a result of the detection, and it is determined that it is larger than the given value. In response, one or more contributing basis elements are added to contribute to the part(s). A computation 72 of the new corresponding network load is carried out. During the one selecting (S50), the detection 70 and the following computation 72 may be repeated until the respective simulation compression ratio of the part(s) of respective linear combinations to be displayed reaches the given value, or, equivalently, until the network load reaches the maximal network load.

In a second example of FIG. 7b, the given value of the reconstruction error is determined so that it is lower than a maximal error value. The maximal error value may be selected automatically by a computer or upon user action. Requiring that the given value is lower than the maximal error value is fitting an accuracy requirement. A detection 74 of the current number of basis elements contributing to the part(s) of respective linear combinations to be displayed is carried out. The respective reconstruction error of the part(s) of respective linear combinations is computed, and it is determined that it is larger than the given value. In response, one or more contributing basis elements are added to contribute to the part(s). A computation 76 of the new respective reconstruction error of the new part(s) of respective linear combinations is carried out. During the one selecting (S50), the detection 74 and the following computation 76 may be repeated until the respective reconstruction error of the part(s) of respective linear combinations to be displayed reaches the given value, thus is lower than the maximal error value. It means that the simulation display fits the requirement of accuracy.

Figure 8:
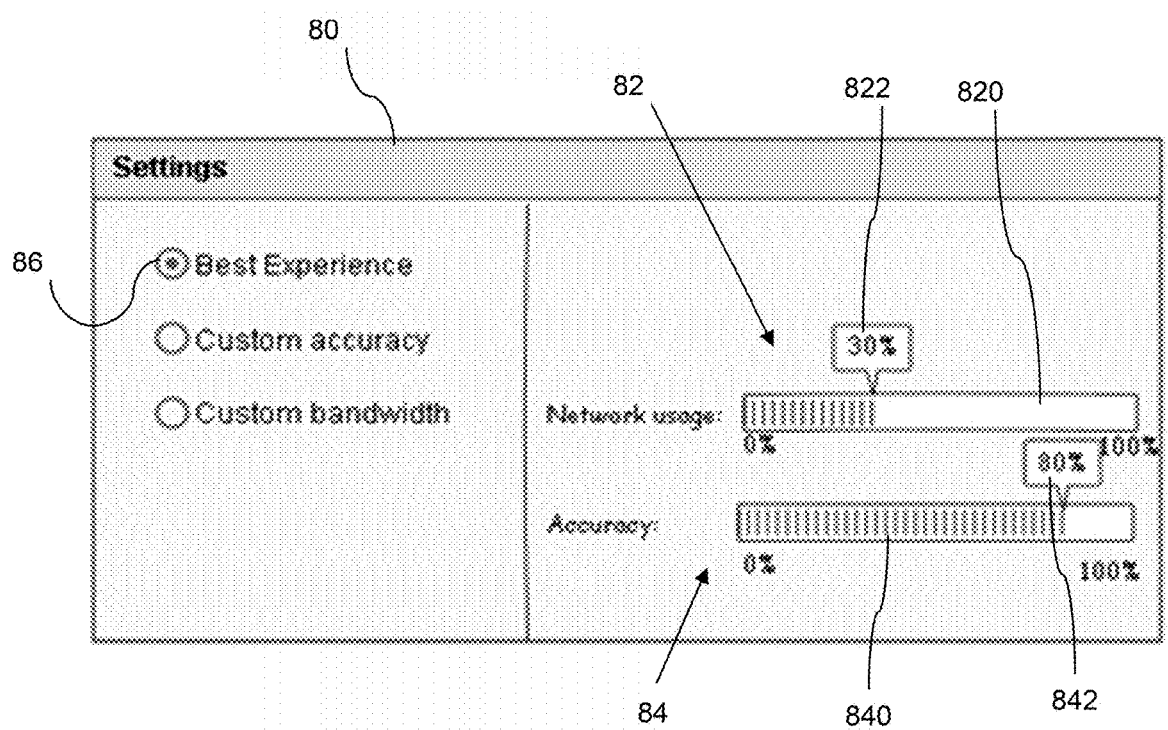
FIGS. 8, 9 and 10 illustrate examples of determining the given value.

FIG. 8 shows an example where the given value is determined according to a best user experience which is that the simulation is displayed with a maximal accuracy while minimizing the amount of data sent through the network. Specifically, the maximal accuracy equals 80% and the minimized amount of data is such that the network usage equals 30%. A settings window 80 is displayed to a user and the user chooses the best experience setting 86. A visual indication 82 of the network usage is displayed. The visual indication 82 includes a status bar 820 of the network usage and a visual information 822 that the best experience network usage is 30%. A visual indication 84 of the accuracy is displayed. The visual indication 84 includes a status bar 840 of the accuracy and a visual information 842 that the best experience network usage is 80%. This best setup may be proposed automatically by a system and ensures an optimal balance between accuracy and transfer speed.

Figure 9:
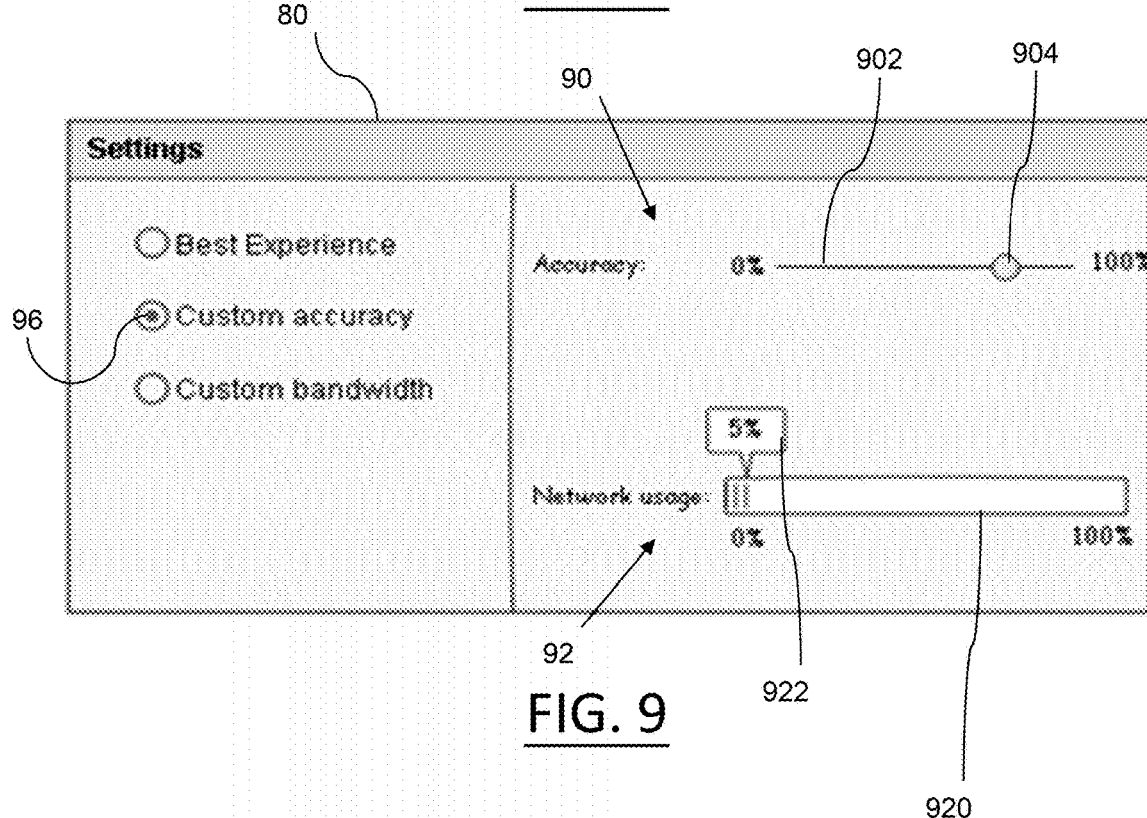

FIG. 9 shows another display of the settings window 80 with another user's choice of setting. The user has chosen the custom accuracy setting 96. This setting allows the user to select a requirement of accuracy. A visual indication 90 of the accuracy is display. It includes a status bar 902 of the accuracy and a cursor 904 on the status bar 902. To select the requirement, the user moves the cursor 904 along the status bar 902, for instance by interacting with a GUI using a touch or a haptic device, until it reaches the desired requirement of accuracy. Upon the user moving the cursor 904, the given value of the reconstruction error is automatically determined: indeed, as already explained, there is a direct connection of the reconstruction error with the accuracy of the simulation display. Simultaneously, the method displays a visual information 92 of the network usage that is required for the accuracy chosen by the user. The visual indication 92 includes a status bar 920 of the network usage and a visual information 922 that the network usage that corresponds to the user's choice of accuracy requirement is 5%. In examples, an information, for instance a noisy and/or visual pop-up window, may be displayed to inform the user that his/her choice of accuracy requirement triggers a too important network usage that may cause a bottleneck. In these examples, the information may include a suggestion to lower the accuracy requirement, possibly indicating a suitable accuracy level determined from measurements of the network usage.

Figure 10:
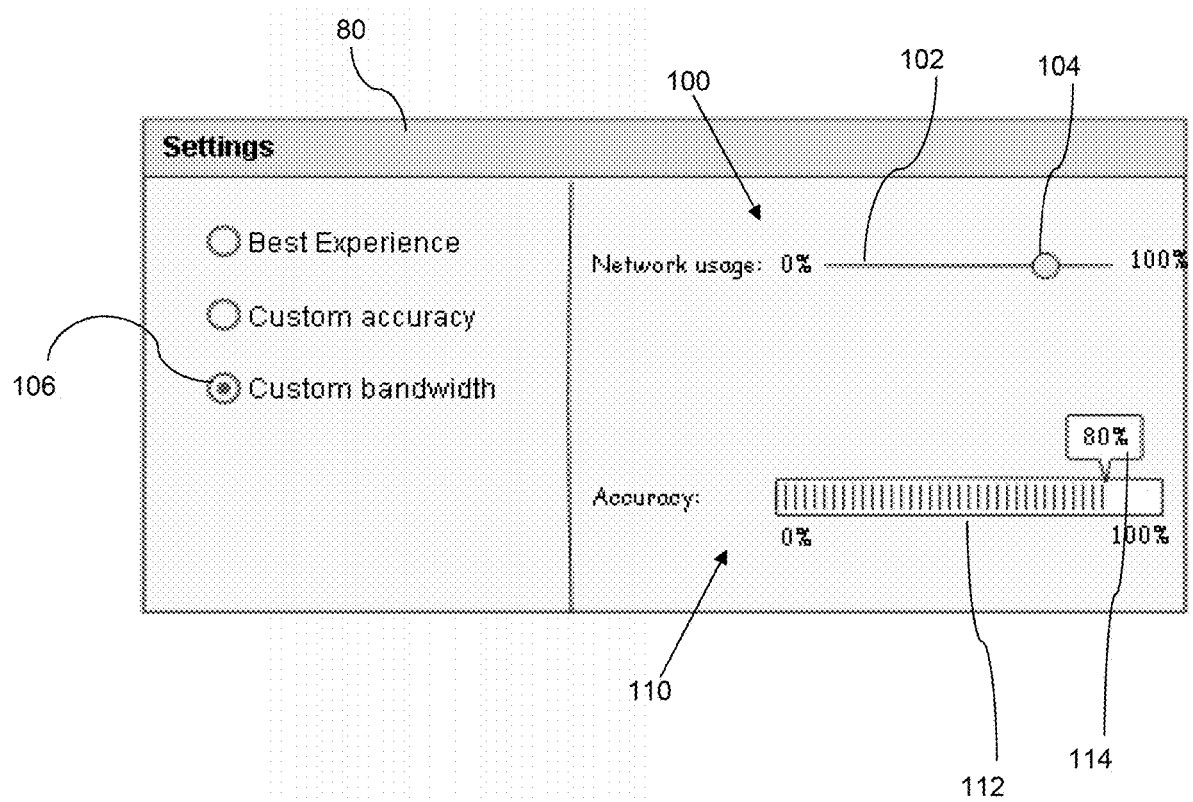

FIG. 10 shows another display of the settings window 80 with another user's choice of setting. The user has chosen the custom bandwidth setting 106. This setting allows the user to select a bandwidth/network usage. In the example of FIG. 10, selecting the usage is equivalent as selecting the threshold. A visual indication 100 of the network usage is display. It includes a status bar 102 of the network usage and a cursor 104 on the status bar 102. To select the usage, the user moves the cursor 104 along the status bar 102, for instance by interacting with a GUI using a touch or a haptic device, until it reaches the desired network usage. Upon the user moving the cursor 104, the given value of the simulation compression ratio is automatically determined: indeed, as already explained, there is a direct connection of the reconstruction error with the accuracy of the simulation display. Simultaneously, the method displays a visual information 110 of the display accuracy that is required for the bandwidth usage selected by the user. The visual indication 110 of the accuracy includes a status bar 112 of the network usage and a visual information 114 that the accuracy that corresponds to the user's choice of network usage is 80%. It is to be understood that the system adjusts automatically the accuracy in order to fit the user's requirements of bandwidth use.

In all above examples, it is to be understood that the display of the settings window and the subsequent user's choice can be performed once at an initial stage of the method, in which case the given value stays fixed during all method steps. Alternatively, the display of the settings window 80 and the subsequent user's choice may be performed before each displaying (S60) or before some displaying (S60). In examples, the settings window may be displayed during the whole execution of the method, and the user may switch from one setting to another substantially in real-time. Each display of the settings window 80 may be carried out automatically and possibly in response to a user request, e.g. a user interaction with a GUI. Furthermore, the window 80 may be displayed so that any simulation display (i.e. relative to one or more displaying (S60)) is entirely visible on the screen, for instance by displaying the settings window 80 next to, above, or below the simulation display. The settings window 80 may be (or may part of) a widget.

Figure 11:
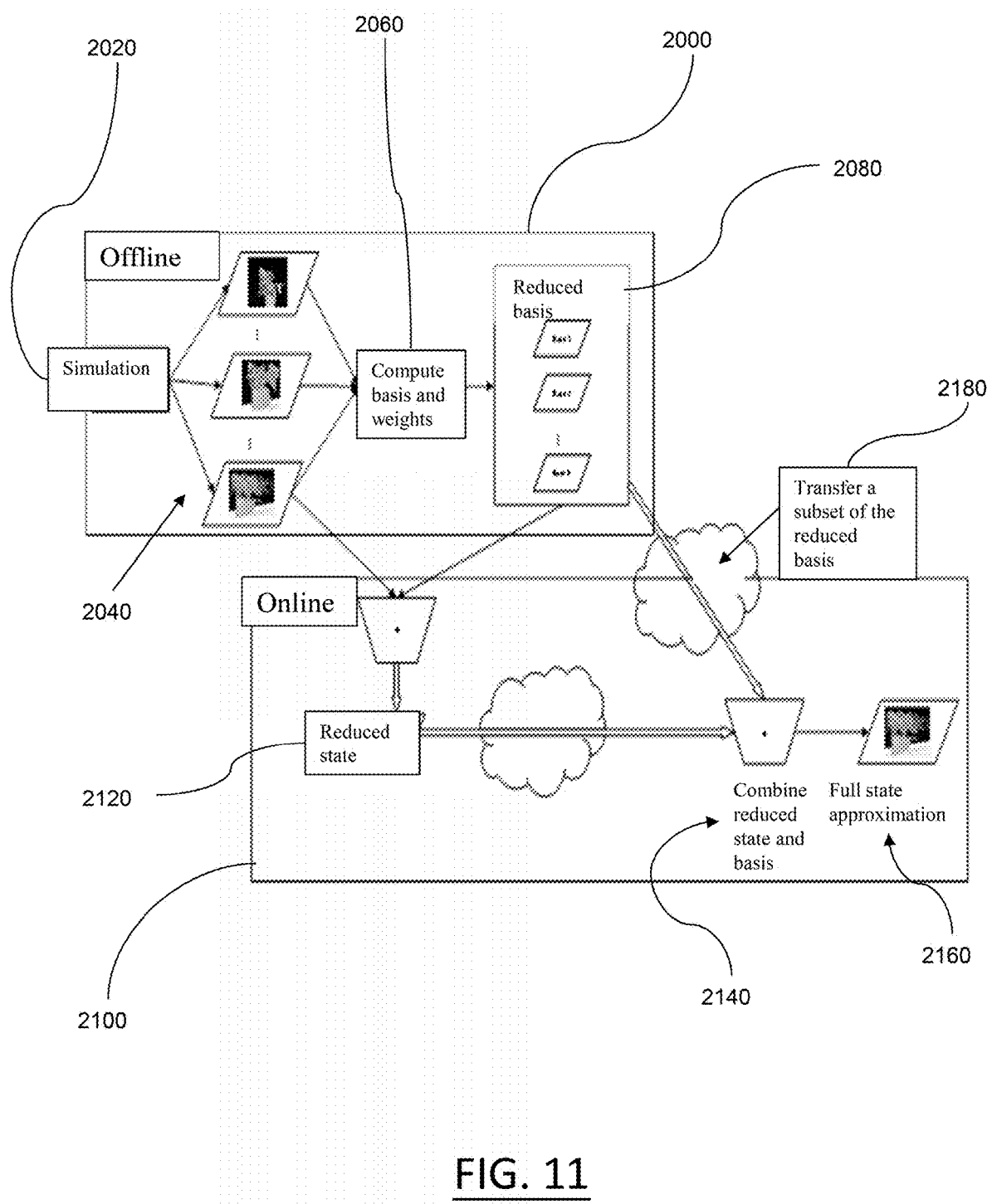
FIG. 11 shows a diagram illustrating an example of the method.

Another example of the method will now be described with reference to FIG. 11.

The method may comprise an offline stage 2000 and an online stage 2100. The offline stage 2000 comprises computing (S10) the full simulation 2020. As a results, all states 2040 are computed. The computed full simulations may be stored for several uses. The online state 2000 further comprises computing (S20) the reduced model, which includes the computation 2060 of the reduced basis 2080 and of the weights, the computation taking as inputs the states 2040 of the computed full simulation 2020. The method further comprises an online stage 2100. The online stage 2100 comprises forming 2120 at least one reduced state, based on the states 2040, the weights, and the reduced basis 2080. The online stage 2100 further comprises the selection (S30) of a number of contributing basis elements, which triggers the transfer 2180 of a corresponding suitable subset of the reduced basis 2080. The online stage 2100 further comprises combining 2140 the subset and the at least one reduced state 2120, which results in displaying (S30) at least one full state approximation 2160 corresponding to the at least one reduced state 2120.

In examples, the computing (S10) of the full simulation and the computing (S20) of the reduced model of the computed full simulation are performed on a first computer. In these examples, the other steps are performed on a second computer. In these examples, the first and second computer are connected through a network. The first computer may be a server that may include a storage (e.g. a database) that stores the date used for computing the full simulation. The second computer may be a computer client, e.g. a desktop computed, a laptop, a tablet, a smartphone, etc. . . . .

In these examples, the first and second computer may be a computer according to FIG. 2. It is to be understood that the minimal requirements of each of the first and second computers are a central processing unit (CPU) 1010 communicatively coupled with a memory that stores instructions for performing one or more step of the method. The second computer may be suitable to display to a user the simulation. The second may be suitable to display to a user the settings window 80 of FIGS. 7a, 7b, 8, 9 and 10. In examples, the offline stage 2000 and the online stage 2100 according to FIG. 11 may respectively be performed on the first computer and on the second computer.

The invention claimed is:

1. A computer-implemented method for displaying, on a second computer, in an enhanced manner, a simulation computed on a first computer, the first computer and the second computer being connected through a network, while reducing bandwidth use of the network for the displaying, the computer-implemented method comprising:
    on the first computer, computing a full simulation that comprises states;
    on the second computer, computing a reduced model of the computed full simulation, the reduced model comprising a basis of ordered energy modes of the full simulation, the basis of ordered energy modes comprising an energy mode that is ordered first in the basis, each state of the full simulation being represented in the reduced model by a respective linear combination of one or more of the ordered energy modes, where any linear combination of the ordered energy modes of the basis is associated with a respective simulation compression ratio and a respective reconstruction error, the respective simulation compression ratio being a ratio between an amount of data required for the displaying the state represented in the reduced model by the respective linear combination of the one or more of the ordered energy modes and an amount of data required for the displaying the respective linear combination of the one or more energy modes, the respective reconstruction error being a distance between the state represented in the reduced model by the respective linear combination of the one or more of the ordered energy modes and the respective linear combination, the energy mode ordered first in the basis being the energy mode of the basis associated with a smallest respective reconstruction error;
    selecting a number N of energy modes including the one or more of the ordered energy modes in the basis;
    displaying, on a display of the second computer and in the enhanced manner, for at least one state of the full simulation, a part of the respective linear combination that comprises the number N energy modes in the basis, the part representing the at least one state in the reduced model, the number N being modifiable so that the respective simulation compression ratio associated with the part of the respective linear combination is adapted to a network load of the network; and automatically during the displaying on the second computer, for a given simulation compression ratio value that corresponds to a maximal allowed simulation-dedicated network load, repeating, until a simulation-dedicated network load reaches the maximal allowed simulation-dedicated network load, by either the first computer or the second computer:

determining that a current simulation-dedicated network load is either smaller than or larger than the maximal allowed simulation-dedicated network load by determining that the respective simulation compression ratio of the part is either smaller than or larger than the given simulation compression ratio value, and upon determining that the current simulation-dedicated network load is either smaller than or larger than the maximal allowed simulation-dedicated network load, modulating the network load of the network by modifying the respective simulation compression ratio of the part by modifying the number N and updating the displaying according to the modified number N.

2. The method of claim 1, wherein the given simulation compression ratio value is determined so that an amount of data sent through the network for displaying the simulation is below a threshold.

3. The method of claim 2, wherein the threshold is selected upon user action.

4. A non-transitory data storage medium having recorded thereon a computer program comprising instructions for performing a method for displaying, on a second computer, in an enhanced manner, a simulation computed on a first computer, the first computer and the second computer being connected through a network, while reducing bandwidth use of the network for the displaying, the method comprising:

on the first computer, computing a full simulation that comprises states;

on the second computer, computing a reduced model of the computed full simulation, the reduced model comprising a basis of ordered energy modes of the full simulation, the basis of ordered energy modes comprising an energy mode that is ordered first in the basis, each state of the full simulation being represented in the reduced model by a respective linear combination of one or more of the ordered energy modes, where any linear combination of the ordered energy modes of the basis is associated with a respective simulation compression ratio and a respective reconstruction error, the respective simulation compression ratio being a ratio between an amount of data required for the displaying the state represented in the reduced model by the respective linear combination of the one or more of the ordered energy modes and an amount of data required for the displaying the respective linear combination of the one or more energy modes, the respective reconstruction error being a distance between the state represented in the reduced model by the respective linear combination of the one or more of the ordered energy modes and the respective linear combination, the energy mode ordered first in the basis being the energy mode of the basis associated with a smallest respective reconstruction error;

selecting a number N of energy modes including the one or more of the ordered energy modes in the basis;

displaying, on a display of the second computer and in the enhanced manner, for at least one state of the full simulation, a part of the respective linear combination that comprises the number N energy modes in the basis, the part representing the at least one state in the reduced model, the number N being modifiable so that the respective simulation compression ratio associated with the part of the respective linear combination is adapted to a network load of the network; and automatically during the displaying on the second computer, for a given simulation compression ratio value that corresponds to a maximal allowed simulation-dedicated network load, repeating, until a simulation-dedicated network load reaches the maximal allowed simulation-dedicated network load, by either the first computer or the second computer:

determining that a current simulation-dedicated network load is either smaller than or larger than the maximal allowed simulation-dedicated network load by determining that the respective simulation compression ratio of the part is either smaller than or larger than the given simulation compression ratio value, and upon determining that the current simulation-dedicated network load is either smaller than or larger than the maximal allowed simulation-dedicated network load, modulating the network load of the network by modifying the respective simulation compression ratio of the part by modifying the number N and updating the displaying according to the modified number N.

5. A computer comprising:

at least one processor coupled to a memory and a display, the memory having recorded thereon a computer program comprising instructions for displaying, on a second computer, in an enhanced manner, a simulation computed on a first computer, the first computer and the second computer being connected through a network, while reducing bandwidth use of the network for the displaying, that when executed by the at least one processor causes the at least one processor to be configured to on the first computer, compute a full simulation that comprises states, on the second computer, compute a reduced model of the computed full simulation, the reduced model comprising a basis of ordered energy modes of the full simulation, the basis of ordered energy modes comprising an energy mode that is ordered first in the basis, each state of the full simulation being represented in the reduced model by a respective linear combination of one or more of the ordered energy modes, where any linear combination of the ordered energy modes of the basis is associated with a respective simulation compression ratio and a respective reconstruction error, the respective simulation compression ratio being a ratio between an amount of data required for the displaying the state represented in the reduced model by the respective linear combination of the one or more of the ordered energy modes and an amount of data required for the displaying the respective linear combination of the one or more energy modes, the respective reconstruction error being a distance between the state represented in the reduced model by the respective linear combination of the one or more of the ordered energy modes and the respective linear combination, the energy mode ordered first in the basis being the energy mode of the basis associated with a smallest respective reconstruction error, select a number N of energy modes including the one or more of the ordered energy modes in the basis, display, on the display of the second computer and in the enhanced manner, for at least one state of the full simulation, a part of the respective linear combination that comprises the number N energy modes in the basis, the part representing the at least one state in the reduced model, the number N modifiable so that the respective simulation compression ratio associated with the part of the respective linear combination is adapted to a network load of the network, and automatically during the displaying on the second computer, for a given simulation compression ratio value that corresponds to a maximal allowed simulation-dedicated network load, repeat, until a simulation-dedicated network load reaches the maximal allowed simulation-dedicated network load, by either the first computer or the second computer the at least one processor is configured to:

determine that a current simulation-dedicated network load is either smaller than or larger than the maximal allowed simulation-dedicated network load by determining that the respective simulation compression ratio of the part is either smaller than or larger than the given simulation compression ratio value, and upon determining that the current simulation-dedicated network load is either smaller than or larger than the maximal allowed simulation-dedicated network load, modulate the network load of the network by modifying the respective simulation compression ratio of the part by modifying the number N and updating the displaying according to the modified number N.

6. A system comprising:

a first computer connected to a second computer through a network, while reducing bandwidth use of the network for displaying, the first computer and the second computer each comprising a respective processor coupled to a respective memory, each memory having recorded thereon instructions for displaying, on the second computer, in an enhanced manner, a simulation computed on the first computer that when executed by the respective processor causes the respective processor to be configured to on the first computer, compute a full simulation that comprises states, on the second computer, compute a reduced model of the computed full simulation, the reduced model comprising a basis of ordered energy modes of the full simulation, the basis of ordered energy modes comprising an energy mode that is ordered first in the basis, each state of the full simulation being represented in the reduced model by a respective linear combination of one or more of the ordered energy modes, where any linear combination of the ordered energy modes of the basis is associated with a respective simulation compression ratio and a respective reconstruction error, the respective simulation compression ratio being a ratio between an amount of data required for the displaying the state represented in the reduced model by the respective linear combination of the one or more of the ordered energy modes and an amount of data required for the displaying the respective linear combination of the one or more energy modes, the respective reconstruction error being a distance between the state represented in the reduced model by the respective linear combination of the one or more of the ordered energy modes and the respective linear combination, the energy mode ordered first in the basis being the energy mode of the basis associated with a smallest respective reconstruction error, select a number N of energy modes including the one or more of the ordered energy modes in the basis, display, on a display of the second computer and in the enhanced manner, for at least one state of the full simulation, a part of the respective linear combination that comprises the number N energy modes in the basis, the part representing the at least one state in the reduced model, the number N being modifiable so that the respective simulation compression ratio associated with the part of the respective linear combination is adapted to a network load of the network, and automatically during the displaying on the second computer, for a given simulation compression ratio value that corresponds to a maximal allowed simulation-dedicated network load, repeat, until a simulation-dedicated network load reaches the maximal allowed simulation-dedicated network load, by either the first computer or the second computer the respective processor is configured to:

determine that a current simulation-dedicated network load is either smaller than or larger than the maximal allowed simulation-dedicated network load by determining that the respective simulation compression ratio of the part is either smaller than or larger than the given simulation compression ratio value, and upon determining that the current simulation-dedicated network load is either smaller than or larger than the maximal allowed simulation-dedicated network load, modulate the network load of the network by modifying the respective simulation compression ratio of the part by modifying the number N and updating the displaying according to the modified number N.

* * * * *